United States Patent
Zhang et al.

(10) Patent No.: US 10,761,031 B1
(45) Date of Patent: Sep. 1, 2020

(54) ARBITRARY WAVEFRONT COMPENSATOR FOR DEEP ULTRAVIOLET (DUV) OPTICAL IMAGING SYSTEM

(71) Applicant: KLA Tencor Corporation, Milpitas, CA (US)

(72) Inventors: Qiang Zhang, Fremont, CA (US); Abdurrahman Sezginer, Monte Serano, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 16/119,970

(22) Filed: Aug. 31, 2018

Related U.S. Application Data

(60) Provisional application No. 62/645,394, filed on Mar. 20, 2018.

(51) Int. Cl.
    *G01N 21/88* (2006.01)
    *G01N 21/95* (2006.01)

(52) U.S. Cl.
    CPC ..... *G01N 21/8806* (2013.01); *G01N 21/9501* (2013.01); *G01N 2021/8835* (2013.01); *G01N 2021/8845* (2013.01)

(58) Field of Classification Search
    CPC ........... G01N 21/8806; G01N 21/9501; G01N 2021/8835; G01N 2021/8845
(Continued)

(56) References Cited

U.S. PATENT DOCUMENTS 4,472,029 A 9/1984 Hardy
5,559,338 A 9/1996 Elliott et al.
(Continued)

FOREIGN PATENT DOCUMENTS

| JP | 10312576 | 11/1998 |
|---|---|---|
| JP | 1131652 A | 2/1999 |
| WO | 2009125034 A1 | 10/2009 |

OTHER PUBLICATIONS

Naulleau, et al. Extreme-Ultraviolet Phase-Shifting Point-Diffraction Interferometer: A Wave-Front Metrology Tool With Subangstrom Reference-Wave Accuracy. Applied Optics, vol. 38, No. 35, Dec. 10, 1999. pp. 7252-7263. 12 Pages.
(Continued)

*Primary Examiner* — Tri T Ton
(74) *Attorney, Agent, or Firm* — Kwan & Olynick LLP

(57) ABSTRACT

Disclosed is a system that includes a light source for generating an illumination beam and an illumination lens system for directing the illumination beam towards a sample. The system further includes a collection lens system for directing towards a detector output light from the sample in response to the illumination beam and a detector for receiving the output light from the sample. The collection lens system includes a fixed-design compensator plate having individually selectable filters with different configurations for correcting system aberration of the system under different operating conditions. The system also includes a controller operable for: (i) generating and directing the illumination beam towards the sample, (ii) selecting operating conditions and a filter for correcting the system aberration under such selected operating conditions, (iii) generating an image based on the output light, and (iv) determining whether the sample passes inspection or characterizing such sample based on the image.

22 Claims, 7 Drawing Sheets

(58) Field of Classification Search
USPC .................. 356/237.1–237.6, 239.1–239.8
See application file for complete search history.

(56) References Cited

U.S. PATENT DOCUMENTS

| | | | |
|---|---|---|---|
| 5,759,457 | A | 6/1998 | Inoue et al. |
| 5,966,243 | A | 10/1999 | Braunecker et al. |
| 6,803,994 | B2 | 10/2004 | Margeson |
| 7,800,732 | B2 | 9/2010 | Zimmermann et al. |
| 8,259,764 | B2 | 9/2012 | Fomenkov et al. |
| 8,558,988 | B2 | 10/2013 | Vladimirsky et al. |
| 9,335,206 | B2 | 5/2016 | Zhang et al. |
| 2002/0113953 | A1 | 8/2002 | Chiba |
| 2003/0029716 | A1* | 2/2003 | Chen .................. C23C 14/32 204/192.11 |
| 2004/0042002 | A1 | 3/2004 | Roncone et al. |
| 2006/0028935 | A1* | 2/2006 | Mori .................. G11B 7/1275 369/44.37 |
| 2008/0094616 | A1* | 4/2008 | Tanaka ............... G01N 21/8803 356/237.2 |
| 2008/0170774 | A1* | 7/2008 | Xiong .............. G01N 21/95607 382/144 |
| 2008/0225298 | A1* | 9/2008 | Fairley .............. G01N 21/8806 356/445 |
| 2008/0239926 | A1 | 10/2008 | Tukker et al. |
| 2009/0097001 | A1 | 4/2009 | Trogisch et al. |
| 2018/0073992 | A1 | 3/2018 | Van Voorst et al. |

OTHER PUBLICATIONS

Neal, et al., Shack-Hartmann Wavefront Sensor Precision and Accuracy, WaveFront Sciences, Inc., Albuquerque, NM.SPIE vol. 4779 (2002). pp. 148-160. 13 pages.

Schmidt Corrector Plate, Wikipedia, Nov. 29, 2017. https://en.wikipedia.org/widi/Schmidt_corrector_plate, downloaded Aug. 23, 2018. 3 pages.

Spherical Aberration Compensation Plates, Edmund Optics. https://www.edmundoptics.com/f/spherical-aberration-compensation-plates/14001. Downloaded Aug. 23, 2018. 6 pages.

PCT International Search Report, International Application No. PCT/US2019/019474, filed Feb. 26, 2019. dated May 31, 2019. 3 pages.

PCT Written Opinion, International patent application No. PCT/US/2019/019474. dated May 31, 2019. 7 Pages.

* cited by examiner

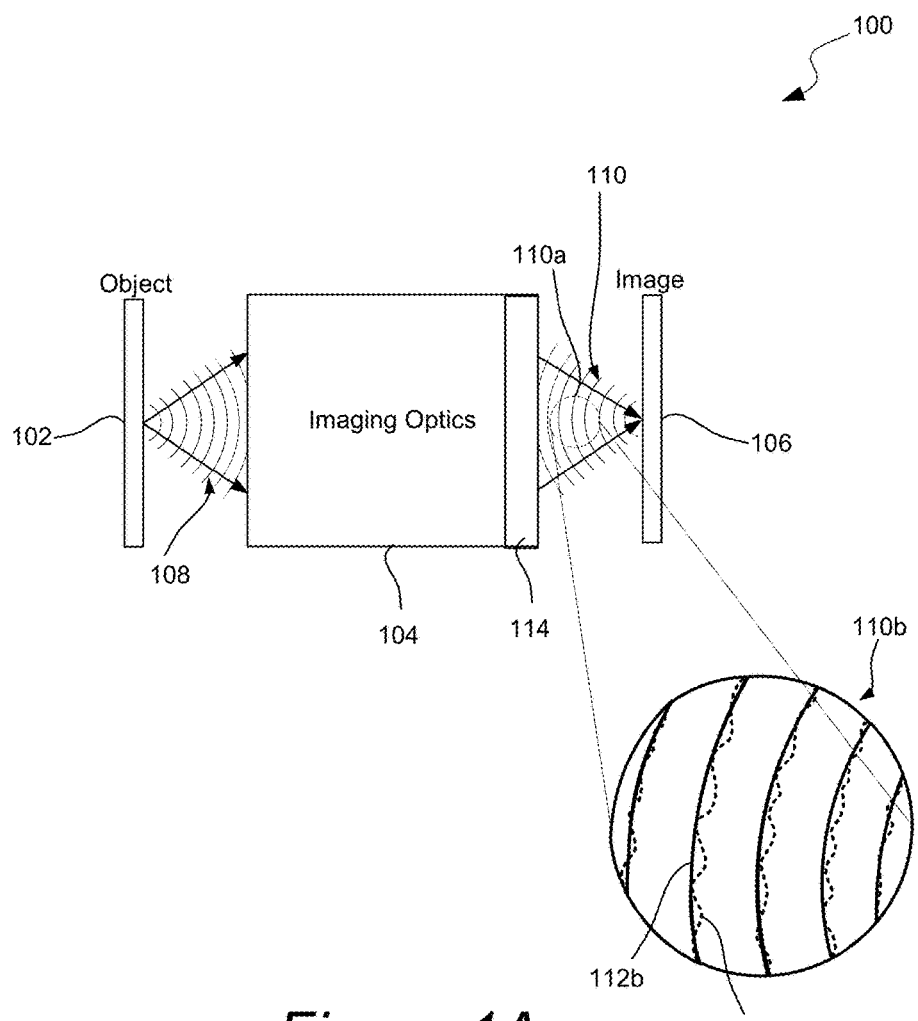
*Figure 1A*
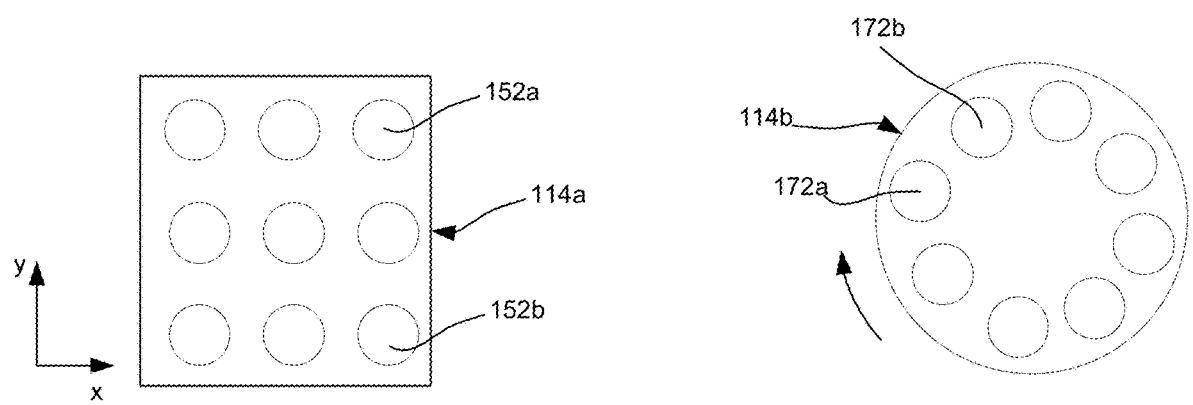
*Figure 1B*  *Figure 1C*

ARBITRARY WAVEFRONT COMPENSATOR FOR DEEP ULTRAVIOLET (DUV) OPTICAL IMAGING SYSTEM

CROSS-REFERENCE TO RELATED APPLICATION

This application claims priority to U.S. Provisional Patent Application No. 62/645,394, filed 20 Mar. 2018, entitled Arbitrary Wavefront Compensator for Deep Ultraviolet (DUV) Optical Imaging System, by Qiang Zhang et al., which application is incorporated herein by reference in its entirety for all purposes.

TECHNICAL FIELD OF THE INVENTION

The invention generally relates to the field of wafer and reticle inspection systems. More particularly the present invention relates to wave front compensation for EUV inspector systems.

BACKGROUND

Generally, the industry of semiconductor manufacturing involves highly complex techniques for fabricating integrated circuits using semiconductor materials which are layered and patterned onto a substrate, such as silicon. An integrated circuit is typically fabricated from a plurality of reticles or masks. Initially, circuit designers provide circuit pattern data, which describes a particular integrated circuit (IC) design, to a reticle production system, which transforms the pattern data into a plurality of reticles. One emerging type of reticle is an extreme ultraviolet (EUV) reticle that is comprised of a plurality of mostly reflecting layers and a patterned absorber layer. A set of reticles are generally used in multiple photolithography processes to transfer the reticle pattern to multiple layers in a semiconductor wafer to thereby form a plurality of integrated circuit (IC) dice.

Due to the large scale of circuit integration and the decreasing size of semiconductor devices, the reticles and fabricated devices have become increasingly sensitive to defects. These defects, if uncorrected, can cause the final device to fail to meet the desired performance due to electrical timing errors. Even worse, such defects can cause the final device to malfunction and adversely affect yield.

As the photolithography used in IC manufacturing is migrating from 193 nm to extreme ultraviolet (EUV), the shrinking size in photomask features and defects of interest continues to push the performance limit of the imaging-based deep ultraviolet (DUV) optical inspection tool. Furthermore, tool-tool matching has also become more difficult as a result of the higher imaging sensitivity to aberration due to the nature of the EUV photomask. There is a strong demand for tighter control of the optical aberration. The utilization of linear polarization in addition to the circular polarization in EUV mask inspection has made this task particularly challenging due to the intrinsic limit of current lens coating design.

SUMMARY

The following presents a simplified summary of the disclosure in order to provide a basic understanding of certain embodiments of the invention. This summary is not an extensive overview of the disclosure and it does not identify key/critical elements of the invention or delineate the scope of the invention. Its sole purpose is to present some concepts disclosed herein in a simplified form as a prelude to the more detailed description that is presented later.

In one embodiment, an inspection system for detecting defects in a semiconductor sample is disclosed. The system includes a light source for generating an illumination beam and an illumination lens system for directing the illumination beam towards a sample. The system further includes a collection lens system for directing towards a detector output light from the sample in response to the illumination beam and a detector for receiving the output light from the sample. The collection lens system includes a compensator plate having a plurality of individually selectable filters having different configurations for correcting system aberration of the system under different operating conditions, and each filter has a fixed design. The system also includes a controller operable to perform the following operations in cooperation with the light source, illumination lens system, collection lens system, and detector: (i) generating and directing the illumination beam towards the sample, (ii) selecting a set of the different operating conditions and a selected one of the filters for correcting the system aberration under such selected set of operating conditions, (iii) generating an image based on the output light from the sample in response to the illumination beam, and (iv) determining whether the sample passes or fails inspection or characterizing such sample based on the image.

In one aspect, the filter plate is positioned for inserting selected ones of the filters at the image pupil of the system. In a specific implementation, the filters are arranged in a grid pattern on the compensator plate, and individual ones of the filters are selectable by moving the filter plate in X and Y directions that are perpendicular to the illumination beam. In another example, the filters are arranged in a circular pattern on the compensator plate, and individual ones of the filters are selectable by rotating the filter plate under the illumination beam.

In one example, the different operating conditions include different polarizations (e.g., circular and linear polarizations). In a further aspect, the different operating conditions include different zoom settings, different aperture sizes, and different wavelength ranges, including a deep ultraviolet range. In another aspect, each filter has a transparent substrate coated with a dielectric thin film with variations in thickness to correct the system aberrations under the different operating conditions. In another aspect, each filter has a transparent substrate having variations in height to correct the system aberrations under the different operating conditions. In an alternative embodiment, each filter has a reflecting substrate coated with a dielectric thin film having variations in thickness to correct the system aberrations under the different operating conditions. In an alternative embodiment, each filter has a reflecting multilayer thin film conformally coated on top of a substrate having variations in height to correct the system aberrations under the different operating conditions.

In another embodiment, the invention pertains to a method of designing and using a compensator in an inspection system for detecting defects in a semiconductor sample. For a plurality of different sets of operating conditions, a system aberration of the inspection system is determined, and a filter plate having a plurality of filters for the different sets of operating conditions for correcting the determined system aberration is fabricated. Each filter has a fixed design. The filter plate is inserted within the inspection system so that each filter is individually selectable to be positioned at an image pupil of the inspection system. On the inspection system, one of the different sets of operating conditions and one of the filters that is configured to correct the system aberration determined for such selected set of operating conditions are selected. The sample is then imaged via the selected filter and under the selected set of operating conditions so that an image of the sample is formed via removal of the system aberrations.

In one aspect, the plurality of filters are fabricated using an ion beam deposition with one or more pin hole or shadow masks to form a thin film having variable heights for correcting the system aberration. In another aspect, the filters are fabricated using an etching process to etch a substrate to have variable heights for correcting the system aberration.

These and other aspects of the invention are described further below with reference to the figures.

BRIEF DESCRIPTION OF THE DRAWINGS

FIG. 1A is a diagrammatic representation of using a spatial filter to compensate for wavefront aberration of a DUV imaging system in accordance with one embodiment of the present invention.

FIG. 1B illustrates a grid type multi-filter plate in accordance with one embodiment of the present invention.

FIG. 1C illustrates a circular type multi-filter plate in accordance with an alternative embodiment of the present invention.

DETAILED DESCRIPTION OF EXAMPLE EMBODIMENTS

Figure 2:
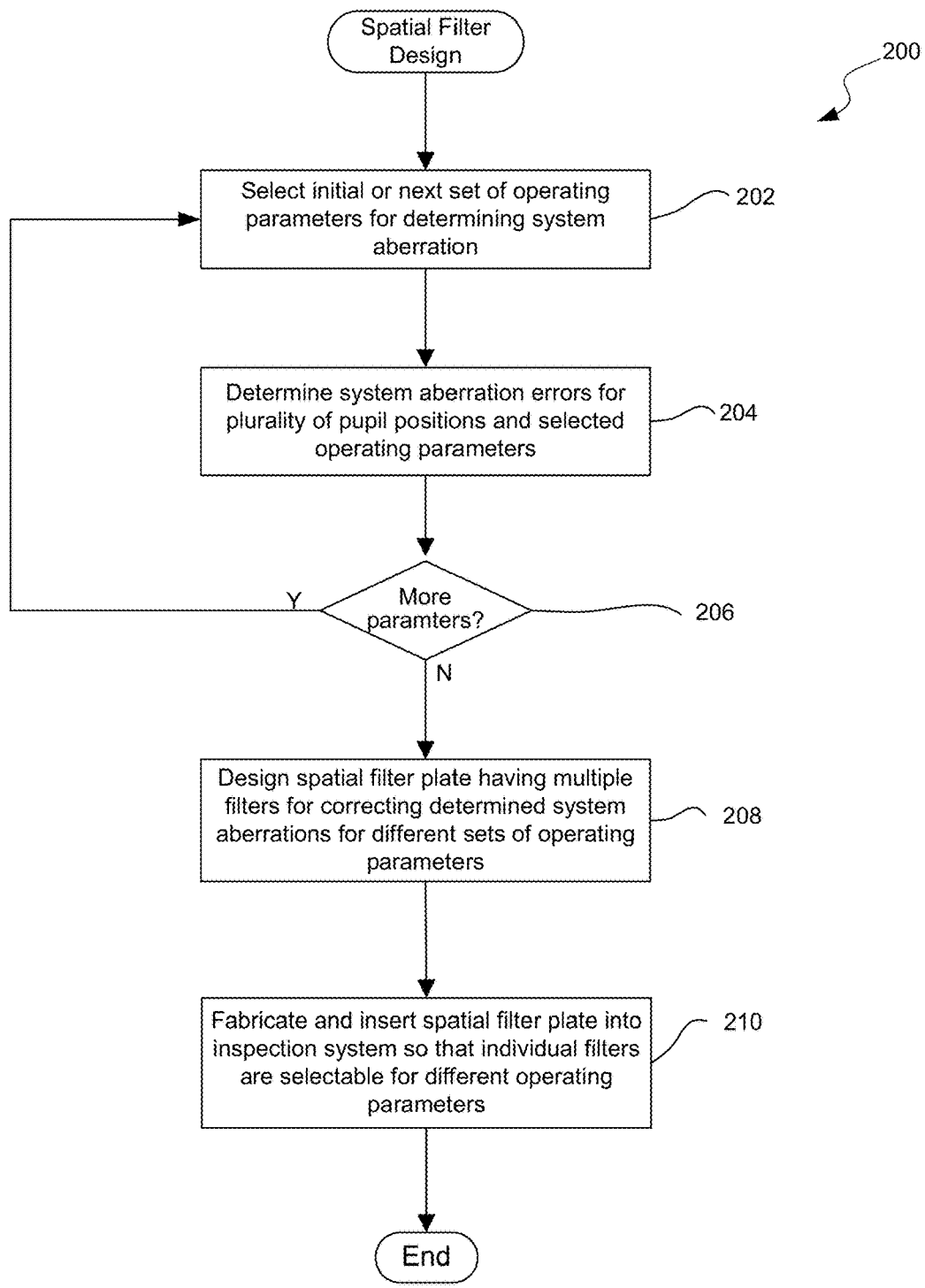
FIG. 2 is a flow chart illustrating a spatial filter design process in accordance with one embodiment of the present embodiment.

In the following description, numerous specific details are set forth in order to provide a thorough understanding of the present invention. The present invention may be practiced without some or all of these specific details. In other instances, well known component or process operations have not been described in detail to not unnecessarily obscure the present invention. While the invention will be described in conjunction with the specific embodiments, it will be understood that it is not intended to limit the invention to the embodiments.

INTRODUCTION

Wavefront metrology and control is generally an important topic for all high-resolution optical imaging systems that operate near the diffraction limit. An undesired amount of optical aberration present in the optical imaging system can cause image distortion and asymmetry, as well as image contrast reduction and Strehl loss. Therefore, optical aberration is closely linked to the system performance and quality.

As a consequence of tighter aberration control requirements, the production cost and lead time of key optical components, particularly the high numerical aperture (NA) DUV imaging objective, has increased significantly, lifting the overall cost of the tool. Furthermore, whenever the aberration of an objective is out of specification, reducing such aberration would often entail a costly swap of optical components and a long waiting time for such replacement parts.

Some systems for aberration compensation include programmable piezoelectric or micro-electro-mechanical (MEM) system based on deformable mirror positioned at the imaging pupil, a programmable liquid crystal-based spatial light modulator (SLM) positioned at the imaging pupil, and spatially programmable lens heating elements in the imaging objective lens.

A wavefront correction mechanism that employs programmable piezoelectric or MEMS based deformable mirror operates in reflection mode. To facilitate the repetitive mirror facet deformation, metallic mirror coatings are typically used, and these coatings tend to have poor reflectivity in the DUV wavelength below 200 nm and would compromise the system's optical efficiency. Additionally, these devices cannot maintain mirror position for an extended period of time and tend to drift over time on the order of minutes. Frequent mirror position calibrations would be required which is generally not practical during the inspection process for a reticle or wafer, by way of example.

Wavefront correction mechanisms that employ programmable liquid crystal based SLM typically support only wavelengths longer than 400 nm due to strong absorption and scattering losses at shorter wavelength and, therefore, are not suitable for DUV applications. Wavefront correction mechanisms that employ spatially programmable lens heating elements in the imaging objective lens rely on inducing large temperature gradient in a given lens element. For objectives with a relatively small aperture size, such as those typically used for reticle or wafer inspection purposes, this large gradient feature could add significant challenges to the thermal management of the objective lens. For instance, a significant and costly redesign of the objective lens would likely be needed to accommodate this large temperature gradient.

Compensator Embodiments

Certain embodiments of the present invention provide a simple and cost-effective techniques and systems for designing, fabricating, and using a customized spatial optical filter as a wavefront compensator, which can significantly improve the system aberration of an optical inspection system. The terms "spatial filter", "filter", "spatial filter plate", and "filter plate" are used herein to refer to a static (non-configurable) compensator (or set of compensators) for correcting system aberration. In one embodiment, the spatial filter is simply inserted at the imaging pupil position of an existing imaging system. FIG. 1 is a diagrammatic representation of using a spatial filter 114 to compensate for wavefront aberration of a DUV imaging system 100 in accordance with one embodiment of the present invention. As shown, an object 102 may be imaged by either transmission or reflection of an electromagnetic waveform or light (e.g., DUV light), represented by a plurality of wavefronts 108, from the object 102. The light passes through any suitable number and type of imaging optics 104, which will have an associated aberration. The spatial filter 114 is designed to compensate for such aberration, resulting in compensated waveforms 110, which may then be used to form an image 106 of the object 102, e.g., via a detector (not shown).

Area 110b is an enlargement of area 110a of the waveforms after passing through the imaging optics 104. Without the spatial filter 114, the imaging optics 104 would result in a distorted wavefront (e.g., dotted line 112a). These aberrated portions of the wavefront, which do not follow the ideal non-aberration wavefront curve (e.g., solid line 112b), will cause rays to be scattered so as to blur/distort the image. By inserting a carefully designed filter 114 into the imaging system 100, however, the aberration effect can be minimized or eliminated, resulting in a more ideal wavefront having no or minimum aberration that would otherwise result from the imaging optics 104 without such filter placement.

A filter plate may be designed to contain a plurality of individual filters for selectively inserting into the pupil under different operating conditions that differently affect the aberration. That is, different filters may be designed to compensate for different sets of aberration errors that are present under different operating conditions. FIG. 1B illustrates a grid type filter plate 114a in accordance with one embodiment of the present invention. As shown, the filter plate 114a includes a plurality of different filters (e.g., 152a and 152b) that are laid out in a grid pattern. Individual filters may be selectively placed in the pupil by moving the filter plate in an XY plane that is perpendicular to the wavefront's travel direction.

FIG. 1C illustrates a circular type filter plate 114b in accordance with an alternative embodiment of the present invention. In this example, the filter plate 114b includes a plurality of different filters (e.g., 172a and 172b) that are positioned in a circular pattern so that individual filters may be selectively rotated into the pupil. Concentric circles of filters are also contemplated, and can be selective positioned via rotation and XY movement.

Any suitable technique may be utilized to design a spatial filter for use as a system aberration compensator. FIG. 2 is a flow chart illustrating a spatial filter design process 200 in accordance with one embodiment of the present embodiment. As shown, an initial set of operating parameters may be selected for determining system aberration in operation 202. The operating parameters generally affect the system aberration errors that are present for the particular inspection or imaging system in which the filter design is to be implemented. By way of examples, the operating parameters may include a wavelength range, polarization setting, zoom setting, numerical aperture (NA), etc. Additionally, this filter design process may be repeated whenever a filter-configured system exhibits aberration, e.g., when an optical component is replaced or altered.

System aberration errors for a plurality of pupil positions and the selected operating parameters may then be determined in operation 204. Any suitable aberration determination technique may be used, and several example techniques are described below. It may then be determined whether there are more operating parameters for filter design consideration in operation 206. If there are more operating parameters for the filter design, the process may be repeated for determining system aberration errors for each next set of operating parameters. For instance, different aberration errors are obtained for each set of selected operating parameters. For example, different aberration errors are determined for each different combination of wavelength range, polarization setting, zoom setting, NA, etc.

After determining aberration errors for all sets of parameters, a spatial filter plate may then be designed in operation 208. The spatial plate may include multiple selectable filters for correcting the system aberrations determined for the different sets of operating parameters. The spatial plate may then be fabricated and inserted into the inspection or imaging system so that individual filters are selectable for different operating parameters in operation 210.

By way of a specific application, certain spatial filters presented herein may provide a number of specific features to enable the functionality and viability of wavefront compensation for a DUV inspection system. Preferably, the spatial filter has a design that is cost-effective to fabricate and has both short-term and long-term wavefront correction stability. For example, the filter may be designed to provide a reasonably long lifetime against DUV optical damage and photo-contamination. In certain examples, this filter is also replaceable if the system aberration changes (e.g. due to optics swap). In another feature example, the spatial filter has an aperture size that matches the system imaging aperture size so as to fit within such pupil. The filter also may be configured to spatially alter the transmissive optical phase within the aperture so as to compensate for the existing system optical aberration while not introducing any significant transmission non-uniformity within the aperture. For instance, transmission loss is less than 10%. Another characteristic of certain filter embodiments includes being configured to correct arbitrary system optical aberration, including both low order Zernikes (Z5-Z16) and high order Zernikes (Z17-Z36).

In certain embodiments, the wavefront compensator is designed to be compact enough to fit several units of such filter into the existing imaging pupil position. For instance, the wavefront compensator may include different filters that can be selectively moved into the pupil for wavefront correction for different operating parameters, such as different polarization settings. For example, a spatial filter plate may be designed to include 3 filters for linear-horizontal, linear-vertical, and circular polarization in a DUV inspection system.

Certain wavefront compensator embodiments may take the form of one or more fixed wavefront correctors with a dielectric thin film coating that has been precisely controlled to have spatial variation of thickness levels. A filter plate may be constructed to work in both transmission and reflection modes. In reflection mode, the selected filter may be compatible with a dielectric mirror so that it supports high optical efficiency. By choosing $SiO_2$ as the thin film material, this filter composition would work well at DUV wavelength down to 193 nm. This type of filter plate can also be made with flexible aperture sizes to fit any given inspection system. For example, different filters can have different aperture sizes for different aperture settings. The aperture may be defined by patterning an opaque metallic film (such as chrome) deposited on top of each filter, or a hard aperture may be situated at the pupil plane but separated from the filter. The filters in a particular filter plate may have different aperture sizes. When implemented in transmission mode, the filter can be inserted at the imaging pupil of the existing inspection system without redesign of the optical components or changes in the system optical layout.

In some examples, a wavefront compensator may be based on a dielectric thin film having a thickness that is spatially controlled during the film deposition (or etch). The thin film material may be chosen such that it is transparent at the operating wavelength and may also be amorphous to minimize the undesired birefringence effect. At the DUV inspection wavelength of 193 nm, $SiO_2$, $MgF_2$, $CaF_2$, etc. works well. Of course, other materials may be used for other imaging or inspection applications, such as different wavelength ranges. In other examples, materials may be selected that work well for 266 nm, 365 nm, etc. Example materials for other wavelength ranges include $Si_3N_4$, $Al_2O_3$, $HfO_2$, $TiO_2$, $Ta_2O_5$, etc.

The thickness distribution of the film may generally be designed to compensate an existing inspection system's optical aberration. Several techniques for measuring a system's aberration are further described below. In one example, the wavefront aberration is measured or calculated at a plurality of positions in the imaging field, and a corresponding pupil filter is designed to compensate for the different aberrations at the different field positions. For a measured pupil wavefront $\phi(x,y)$ in number of waves where x,y are pupil coordinates, the desired film thickness for a transmission filter implementation may be determined by:

$$t_T(x, y) = t_0 - \frac{\lambda}{n-1}\phi(x, y) \qquad \text{Equation [1]}$$

where $\lambda$ is the wavelength, n is the index of refraction of the film, and $t_0$ is the film's nominal thickness when the wavefront aberration is negligible, which may be chosen such that t(x,y) is always positive within the pupil aperture.

For a reflection mode implementation, the light passes through the film twice so that the desired film thickness may be determined by:

$$t_R(x, y) = t_0 - \frac{\lambda}{2(n-1)}\phi(x, y) \qquad \text{Equation [2]}$$

In a specific example system in which the wavelength is 193 nm and using a $SiO_2$ index of refraction of 1.563, the maximum film thickness variation to compensate for a peak-peak wavefront difference of 100 m$\lambda$ is estimated to be approximately 34 nm. This configuration is well within current capabilities of thin film deposition techniques developed for optical coatings, which techniques can typically control film thickness variation with a precision in the sub-nanometer range.

Figure 3:
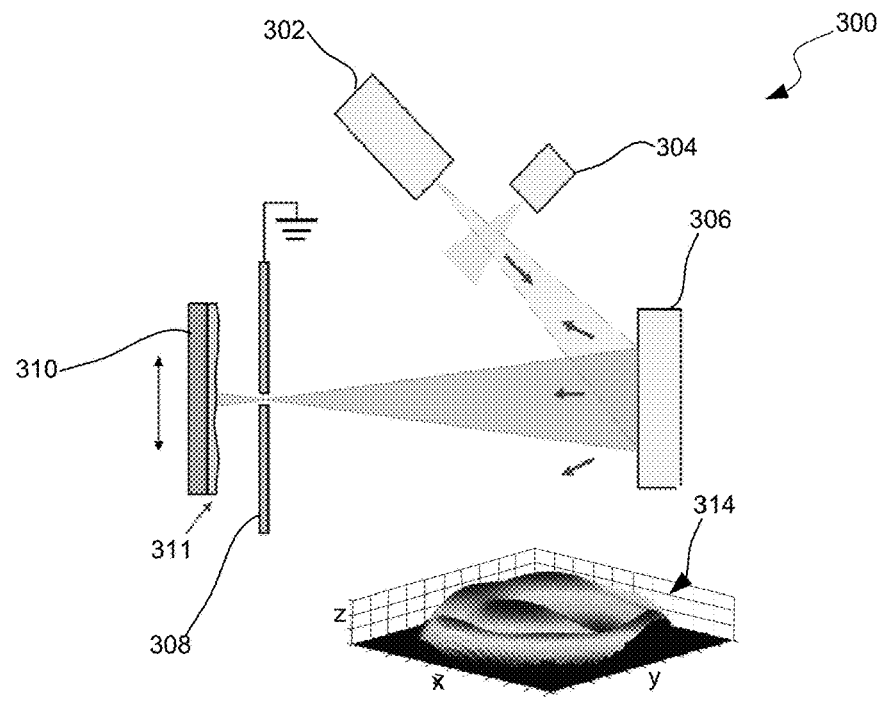
FIG. 3 illustrates a spatial filter fabrication technique utilizing a pinhole deposition mask in conjunction with ion beam deposition in accordance with a first implementation of the present invention.

Any suitable fabrication technique may be used to form a fixed spatial filter for compensation of system aberration. One general fabrication embodiment includes use of a pinhole deposition mask in conjunction with a thin film ion beam deposition technique to achieve precise spatial control for depositing variable film thickness. As shown in FIG. 3, an ion-beam deposition apparatus 300 includes an ion beam generator or gun 302 for generating a beam of ions that are directed towards a deposition target 306, which causes deposition material to be ejected and sputtered from the target 306, through a pinhole mask 308 and onto a substrate 310. The system 300 may also include a neutralizer 304 for neutralizing the ions before reaching the sputtering target 306 to minimize charging effect.

For a transmission implementation, the substrate 310 of the filter can be formed from any suitable rigid and transparent material, such as a flat slab of fused silica, etc. The deposited material may be any transparent material with a similar refractive index as the substrate material to minimize reflection, such as $SiO_2$, etc. For a reflective implementation, the substrate 310 may take the form of any rigid reflective material, such as a dielectric mirror, and the deposited material may also be $SiO_2$ or multiple layers having absorption characteristics that achieve minimal light loss (e.g., alternating pairs of molybdenum (Mo) and silicon (Si) layers), etc.

The ion-beam deposition process typically has excellent deposition directionality and film quality, but other deposition techniques, such as other types of sputtering, are also possible. During the illustrated ion-beam deposition, the deposited film will only accumulate within a localized spot on the substrate 310 in line-of-sight of the target through the pinhole. The width, shape and growth rate of the deposition spot can be calibrated and controlled by the size of the pinhole and its distance from the substrate 310.

The substrate 310 may be mounted on a vacuum compatible X-Y translational stage (not shown) driven by any suitable movement mechanism, such as stepper motors. The desired film thickness distribution can be achieved by controlling the dwelling time at each motor step through a computer/processor.

A 3D perspective 314 of the deposited film 311 is also shown. The thickness of the film in this 3D perspective 314 is shown to have different z heights at different XY coordinates. For example, precisely controlled deposition of different amounts of $SiO_2$ are deposited through the pinhole mask 308 onto the substrate by varying the dwell times at different XY positions.

For a pupil aperture size (of the inspection system) and corresponding filter size on the order of a few millimeters, the pinhole size may be selected to be on the order 100-200 microns. The thickness of the pinhole mask 308 may also be selected to be in the sub-millimeter range, depending on the $SiO_2$ target cone angle seen through the pinhole.

For good quality of the deposited film, the peak deposition rate may be limited to approximately 1-2 angstroms/sec. Assuming a 15×15 grid coverage of the pupil, the total deposition time is estimated to be 5-10 hours in order to reach a maximum film thickness of 34 nm, or 100 m$\lambda$ of wavefront difference.

Figure 4:
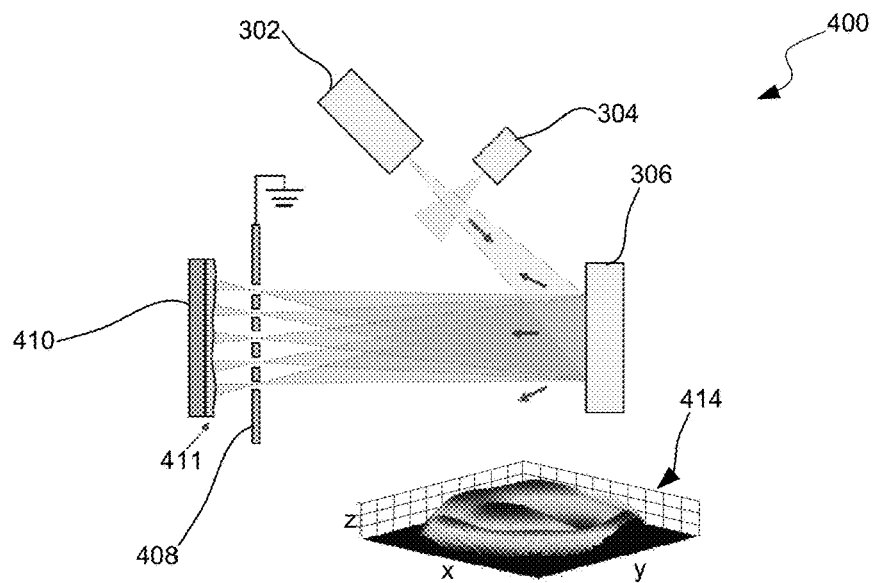
FIG. 4 illustrates a spatial filter fabrication technique utilizing an array pinhole deposition mask in conjunction with ion beam deposition in accordance with a second implementation of the present invention.

In a second implementation, a pinhole array mask, as opposed to a single pinhole mask, could be employed to speed up the deposition process. As illustrated in FIG. 4, the substrate 410, which may have a similar composition as the substrate 310, may remain stationary in this case. For a given system aberration to be compensated, a customized pinhole array mask (e.g., 408) is made. The size of each pinhole in the array may be individually tailored in order to yield a local film growth rate that is proportional to the desired film thickness at that particular pinhole location, which can be calibrated. That is, different locations on the substrate 410 will be subject to different rates of film deposition for differently sized pinholes. The film deposition spots for adjacent pinholes may overlap to ensure good film coverage across the filter substrate 410 and smooth thickness transition. A careful timing of the deposition duration gives the final desired film thickness, which can be as short as a few minutes in comparison to the single pinhole method. A 3D perspective 414 of the deposited film 411 is also shown.

Each pinhole (for the single pinhole and array of pinholes examples) may have any suitable shape, such as circular, oval, square, rectangular, cross, etc. Additionally, the array-type mask may have differently shaped pinholes.

An alternative fabrication technique includes depositing the film with controlled thickness variation by using a small shadow mask (or multi-shadows) as opposed to a pinhole or pinhole array mask. In this case, one or more small disk-like shadow masks are inserted in between the $SiO_2$ target and substrate. The shadow mask(s) reduce the film growth rate locally right behind each mask. The substrate is translated during the deposition with controlled dwelling time.

The single and multiple pinhole (or shadow) mask may each generally be conductive and properly grounded to avoid any charge build-up. These pinhole(s)/shadow(s) mask characteristics can be achieved by using precision machining with laser cutting on a thin metal plate, such as drilling, or a lithographic printing and etching process.

Prior to the film deposition, a clear aperture may be defined and formed on the substrate that matches the size of the pupil aperture of the inspection system for alignment purpose. Alternatively, the aperture of the filters may be used as a replacement to the hard aperture of the system in which the filter plate is being inserted. This combination of aberration filter and aperture could be accomplished by depositing an opaque metallic thin film, such as chrome, followed by lithographic patterning and wet etching to form an aperture region into which the filter's variable height film is deposited. In an alternative embodiment, the aperture may be formed after the film deposition for the filters.

For a transmission implementation, a uniform anti-reflective coating (such as $MgF_2$, etc.) could be deposited on top of the film after deposition to minimize transmission loss due to surface reflection. This coating can also be applied to the backside of the substrate.

Figure 5:
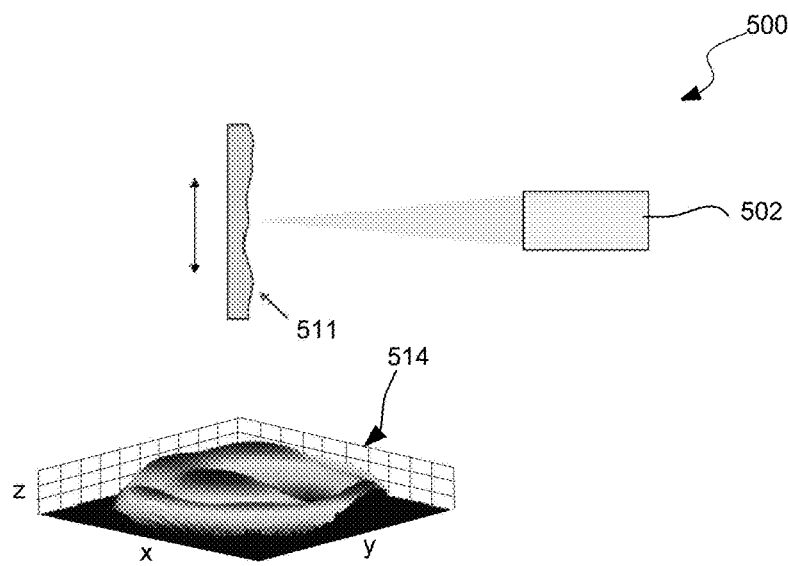
FIG. 5 illustrates a spatial filter fabrication technique utilizing ion beam figuring in accordance with a third implementation of the present invention.

FIG. 5 illustrates a spatial filter fabrication technique utilizing ion beam figuring in accordance with a third implementation of the present invention. In this example, an ion gun 502 is used to produce a high energy focused ion beam that is directed towards a substrate 511, which may have a similar composition as the substrate 310 or 410. The substrate 511 is positioned to receive the high energy ion beam and may be moved relative to the ion beams so as to etch a particular profile in the substrate 511 for aberration compensation. As shown in the 3D perspective 514, the substrate 511 is etched to have varying heights for correcting different aberration errors. In this example, the substrate 511 may be moved on a stage and/or the beam may be displaced relative to the substrate 511. The desired topography for the filter can be achieved by controlling the dwell time of the beam during the scanning for each beam position. An anti-reflective coating may be applied to both sides of the substrate 511 after etching. An aperture may also be formed after or before etching to replace the hard aperture of the system into which the filter plate is to be inserted.

Turning to the filter design process, the system aberration for each parameter set may be determined using any suitable technique, which generally depends on the type of inspection or imaging system for which a spatial filter compensator is being designed. In a UV to visible wavelength range inspection system, aberration may be measured using a Shack-Hartmann sensor. In an EUV actinic system, aberration may be determined by use of a phase-shifting point-diffraction interferometer as described further in "Extreme-ultraviolet phase-shifting point-diffraction interferometer: a wave-front metrology tool with subangstrom reference-wave accuracy" by Patrick P. Naulleau et al, Applied Optics, Vol. 38, No. 35, 10 Dec. 1999, which paper is incorporated herein by reference. Additionally, several examples for determining aberration in an EUV type system are further described in U.S. Pat. No. 9,335,206, issued 10 May 2016, by Zhang et al., which patent is incorporated herein by reference in its entirety.

Figure 6:
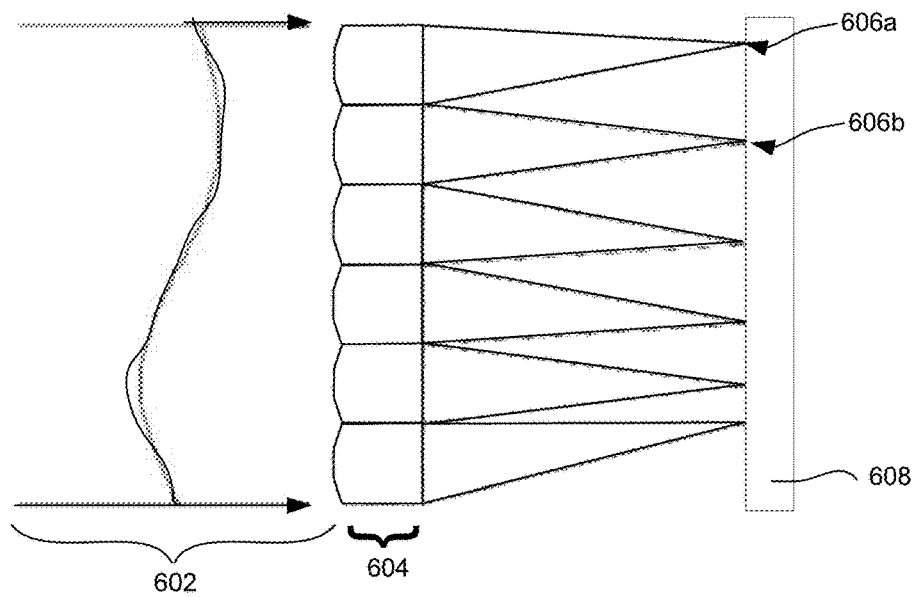
FIG. 6 is a diagrammatic representation of use of a Shack-Hartmann sensor to measure system aberrations in accordance with a specific implementation of the present invention.

A Shack-Hartmann sensor is compact and can provide passive phase and irradiance distribution measurements, including wavefront errors, which are wavelength independent, as well as being relatively insensitive to vibration. FIG. 6 is a diagrammatic representation of use of a Shack-Hartmann sensor to measure system aberrations in accordance with a specific implementation of the present invention. The Shack-Hartmann sensor generally may include a lenslet array 604 for receiving a wavefront 602 and directing a plurality of focused portions (e.g., 606a and 606b) of such wavefront 602 onto a spatial detector array 608. It is noted that the lenslet may contain any number of individual lenses, and only 6 are shown for simplication. In an alternative Hartmann sensor implementation, an array of apertures may replace the lenslet. Referring to the illustrated example, a lenslet array may be formed by a plurality of lenses that are affixed together, binary optics, or other micro-optics techniques. The detector array 608 may be a CCD detector array.

In general, the lenslet 604 forms a plurality of focused spots on the detector array 608. Measurement of the focal spot positions uniquely determines the wavefront slope if the other systems parameters are known since the focal spot positions are related to the average wavefront slope across the lenslet. In general, the spot positions for a sampled irradiance distribution with measured pixel intensities are first determined by the first moments. The calculation of the spot positions may also use thresholding or image deconvolution. The focal spots' positions or "centroids" can then be used to determine the wavefront slope distribution by comparing the measured centroids to a reference wavefront that was measured with the same Shack-Hartmann sensor. For a set of measured centroids $(x_c, y_c)$ and reference centroids $(x_r, y_r)$, the wavefront slope distribution is:

$$\begin{pmatrix} \langle \partial w/\partial x \rangle \\ \langle \partial w/\partial x \rangle \end{pmatrix}_k = \begin{pmatrix} \beta_x \\ \beta_y \end{pmatrix} \approx \frac{1}{L_H} \begin{pmatrix} x_c - x_r \\ y_c - y_r \end{pmatrix}_k$$

where $L_H$, which is the distance between the lenslet array and detector, may be set to the lenslet focal length, f.

The wavefront may then be reconstructed based on the wavefront slope measurements by any suitable technique, such as zonal (direct numerical integration) or modal (polynomial fitting). In the zonal technique, the wavefront gradients can be written in terms of finite-differences, and the data is numerically integrated zone-by-zone (or lenslet by lenslet). The wavefront is approximated by the finite difference and solved via an iterative method, such as least squares fitting. In the modal technique, the wavefront may be described in terms of functions that have analytical derivatives to which the measured slope data is fit to allow a direct determination of the wavefront from the fit coefficients. For instance, the wavefront at point (x,y) may be written as an expansion in terms of polynomials $P_m(x,y)$, such as Zernike polynomials:

$$w(x, y) = \sum_{m=1}^{M} C_m P_m(x, y)$$

then the local wavefront slopes can be written as:

$$\begin{pmatrix} \langle \partial w/\partial x \rangle \\ \langle \partial w/\partial x \rangle \end{pmatrix}_k = \begin{pmatrix} \sum_{m=2}^{M} C_m \frac{\partial P_m}{\partial x} \\ \sum_{m=2}^{M} C_m \frac{\partial P_m}{\partial y} \end{pmatrix}$$

The sum-squares may then be written as:

$$\chi^2 = \sum_k \left( \beta_k^x - \sum_{m=2}^{M} C_m \frac{\partial P_m}{\partial x} \right)^2 + \sum_k \left( \beta_k^y - \sum_{m=2}^{M} C_m \frac{\partial P_m}{\partial y} \right)^2$$

which can be minimized by setting:

$$\frac{\partial \chi^2}{\partial C_m} = 0$$

and solving the resulting system of equations. Several techniques for optimization for determining wavefront error are further described in "Shack-Harmann wavefront sensor precision and accuracy" by Daniel R. Neal et al., which article is incorporated herein by reference.

As described herein, different filters can be designed to compensate for aberration under different operating conditions. For example, the wavefronts for different polarization settings (e.g., circular, x, and y polarization) differ significantly in astigmatism Z5 and Z6 Zernike terms. Particularly, the linear polarization, which is extensively used in EUV mask inspection systems, tend to have larger astigmatism due to the intrinsic limitation of the objective lens coating design for axial symmetric systems. However, individual filter designs as described herein can be designed to correct the wavefront aberrations for these different polarization settings.

Any filter design approach may be used and depends on the particular inspection/imaging system into which the filter is to be inserted. For instance, a Shack-Hartmann sensor may be inserted within a DUV inspection system at the image pupil to determine system aberration and design filters for insertion at such image pupil. Alternatively, aberration may be measured at various positions conjugate to the image pupil. The filter design may be inserted into the same or a different position at which aberration was measured.

Once a filter plate is designed and fabricated based on the determined aberration for one or more sets of operating conditions of a particular inspection/imaging system, the filter plate may be inserted into the optical path of the system so as to correct the determined aberrations for each set of operating conditions. The placement of the filter plate may be selected based on any suitable factor. First the filter plate is positioned to receive the wavefront at a position that allows corrections of the determined system aberrations. Another factor for filter position may be to minimize the power density on the plate or that such power density is below a predefined damage threshold for the particular filter material. In most cases, the position will be selected to avoid a focused narrow beam so as to minimize the power density and resulting damage to the filter. In one embodiment the filter plate is positioned to be movable so as to selectively position each filter at the imaging pupil.

A spatial filter compensator that is designed as described herein may be used in any suitable type of defect inspection system, such as a system for inspecting reticles or wafers. In general, a spatial filter may be added to any system in which system aberration causes imaging problems and it would be beneficial to reduce or eliminate such aberrations.

Certain embodiments of the present invention provide apparatus and techniques for significantly improving the EUV photomask defect sensitivity of current DUV inspection tools by utilizing a spatial filter aberration compensator. In one example, the compensator can be implemented on a DUV inspection tool, such as the Teron™ 6xx inspection tools available from KLA-Tencor of Milpitas, Calif., by inserting a spatial filtering device in the imaging pupil of such tool. The imaging is generally based on reflected light from the sample, which is directed towards sensors via transmissive optics, since EUV masks tend not to be transparent to DUV light. However, alternative embodiments contemplate compensators for transmitted light and/or reflected light from the sample when inspecting a non-EUV mask.

Figure 7:
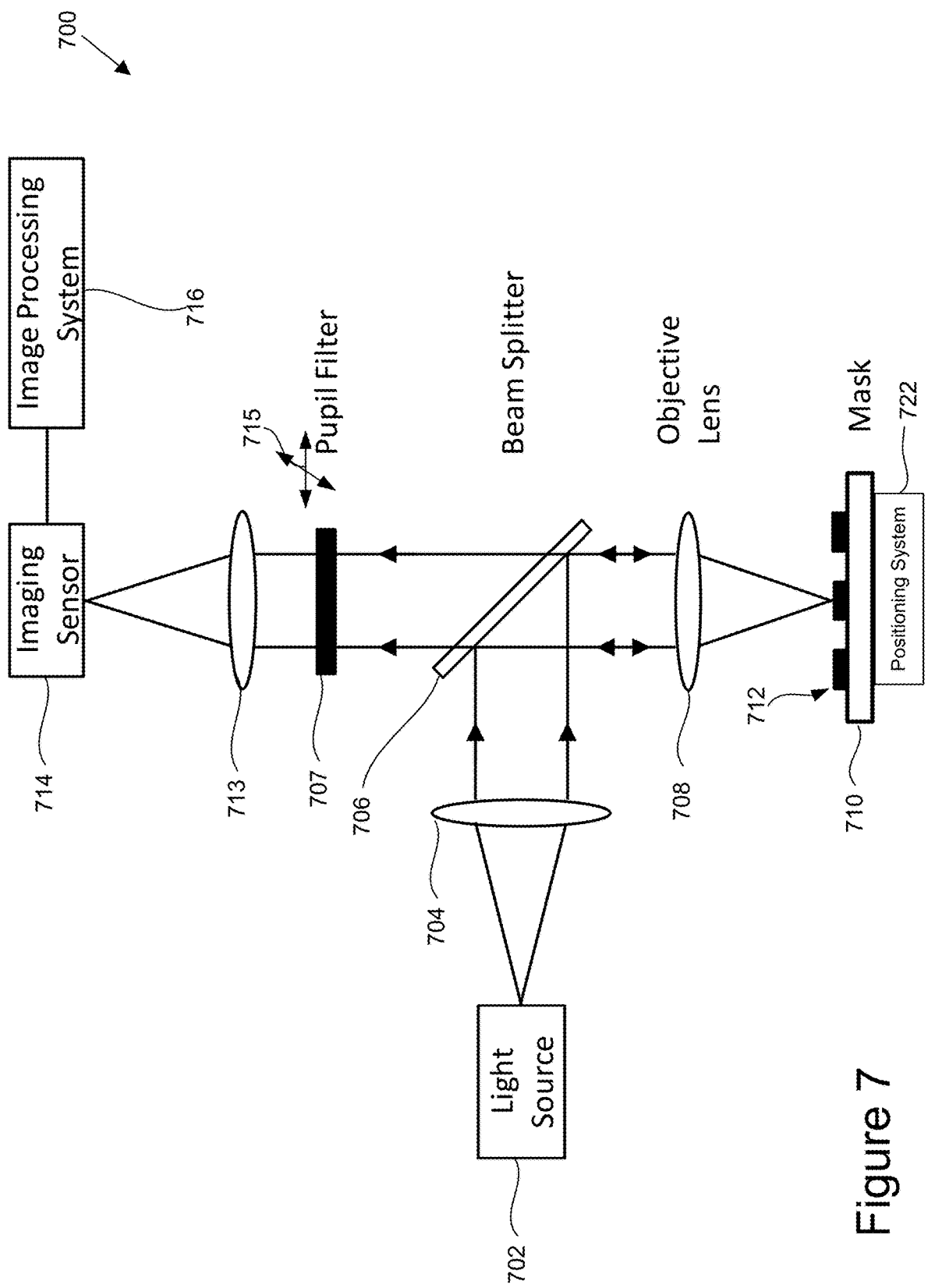
FIG. 7 is a diagrammatic representation of an inspection system that is configured with a spatial filter compensator in accordance with one embodiment of the present invention.

FIG. 7 is a diagrammatic representation of an inspection system 700 that is configured with a system aberration compensator in accordance with one embodiment of the present invention. This system 700 generally includes a light source 702 that is suitable for inspection of the particular sample 710, such as an EUV mask. One example of a light source is a quasi-continuous wave laser. In certain embodiments, a light source may generally provide high pulse repetition rate, low-noise, high power, stability, reliability, and extendibility. It is noted that while an EUV photolithography scanner operates at 13.5 nm wavelength, an inspection tool for an EUV reticle does not have to operate at the same wavelength. A Teron™ system from KLA-Tencor, for example, operating at 193 nm can be used to inspect EUV reticles. The system 700 may include any type and number of light sources. Example light sources include a laser-driven light source, a high-power broadband plasma light source, a transillumination light source (e.g., halogen or Xe lamp), a filtered lamp, LED light sources, etc. Multiple LED or speckle buster laser diodes are also possible sources.

The inspection tool can generally be set up with a set of operating parameters or a "recipe". Recipe settings may include one or more of the following settings: pupil filter selection, zoom settings, one or more defect detection threshold values, a focus setting, an illumination or detection aperture setting, an incident beam angle and wavelength setting, a detector setting, a setting for the amount of reflected or transmitted light, aerial modeling parameters, etc. Certain embodiments of the present invention utilize an inspection system in reflection mode and having a selected polarization, such as linear-horizontal, linear-vertical, circular, etc.

The inspection system includes any number and type of optical elements for directing and focusing an illuminating light beam onto the inspected surface 712. For example, the illumination from the light source may also pass through a number of lenses which serve to relay (e.g., shape, focus or adjust focus offset, filter/select wavelengths, filter/select polarization states, resize, magnify, reduce distortion, etc.) the beam towards the sample. The system 700 may generally include a beam steering device for precise beam positioning and a beam conditioning device, which can be used to provide light level control, speckle noise reduction, and high beam uniformity. Beam steering and/or beam conditioning devices may be separate physical devices from, for example, a laser. For brevity, FIG. 7 illustrates only a condenser lens 704, a beam splitter 706 (such as a dichroic mirror), and an objective lens 708 for the illumination optics. However, one skilled in the art would understand that an inspection system can include other optical or electronic elements for achieving specific inspection functions. The objective lens can be adjusted to different sizes of pixels, e.g., less than about 100 nm for each pixel or, more particularly, less than about 75 nm or even less than 60 nm.

The illumination beam may be directed towards the sample surface 712 at a substantially normal angle with respect to the inspected surface. In other embodiments, an illuminating light beam can be directed at an oblique angle, which allows separation of the illuminating and reflected beams.

The system may also include a tunable or selectable spectral filter that is configurable to increase sensitivity for particular materials and stack types. A spectral filter may be used to further dynamically define the spectrum of the illumination beam. One or more spectral sub-band filters may be placed in an illumination pupil of the illumination beam to achieve different sub-band wavelength ranges. However, the system may include any number and type of lenses for forming an illumination pupil at which a spectral sub-band filter may be positioned. Generally, each inspection wavelength range may be selected based on optimization of its sub-band, illumination and collection pupil aperture shapes, polarization of the illumination and collection path, magnification, pixel size, or any combination thereof.

A polarization setting may also be applied to each wavelength range (or sub-band). For instance, a linear-horizontal polarization may be selected for a selected longer wavelength sub-band. A polarization setting (via a polarization optics module) may be applied based on any suitable inspection parameter, such as defect type, sample geometry and composition, wavelength range or sub-band selection, etc.

The sample 710 and pattern 712 formed thereon may also be placed on a stage (not labeled) of the inspection system 700, and the inspection system 700 may also include a positioning mechanism 722 for moving the stage (and sample) relative to the incident beam. One or more positioning mechanisms may also be configured to move other components of the inspection system, such as the filter plate or filter, aperture modules, illumination or collection mirrors, wavelength filters, polarizers, etc. By way of examples, one or more motor mechanisms may each be formed from a screw drive and stepper motor, linear drive with feedback position, or band actuator and stepper motor.

After the incident beam(s) impinge on the sample 710, the light may then be reflected and diffracted/scattered from the sample 710 in the form of "output light" or an "output beam." The inspection system also includes any suitable lens arrangements for shaping, directing, and focusing the output light towards one or more detectors. As shown, an output beam can be received by a detector or imaging lens 713, which directs the output beam towards a detector or imaging sensor 714. In certain embodiments, the sensor 714 is a time delay integration (TDI) detector. A typical TDI detector accumulates multiple exposures of the same area of the inspected surface, effectively increasing the integration time available to collect incident light. In general, a sensor or detector may include transducers, collectors, charge-coupled devices (CCDs), or other types of radiation sensors.

The system 700 also includes a spatial pupil filter 707 that is arranged to filter light reflected/scattered by or reflected from sample 710, to compensate for system aberrations as described herein. For instance, each filter in the spatial filter 707 may take the form of a fixed spatial filter having various heights for adjusting the aberration at different positions in the collection pupil under a particular set of operating conditions. In another example, multiple spatial filters having different compensator characteristics (e.g., for different operating parameters) may be provided in a movable filter plate structure (e.g., filter plate of FIG. 1B or 1C). As shown, the filter plate 707 is movable and may be positioned in the collection path at different XY positions (715) to move a selected spatial filter into the collection pupil. In another example, the filters may be arranged in a circular pattern, and a particular spatial filter may be rotated into the collection path.

The illumination and collection optical elements of the system may be reflective or transmissive. The output beam may be reflected or scattered from the sample or transmitted through the sample. The system may also include components for optional polarized light in each illumination and collection path, optional spectral sub-band filters, and optional aperture shapes in the illumination and collection paths for the inspection of reticles or other samples. Examples of other types of inspection systems, in which a filter plate as designed herein, are further described in U.S. patent application Ser. No. 15/438,588, filed 21 Feb. 2017, entitled "INSPECTION OF PHOTOMASKS BY COMPARING TWO PHOTOMASKS" and the above referenced Zhang Patent, which are incorporated herein by reference.

Each sensor 714 may also be coupled with an image processing system 716 or, more generally, coupled with a signal processing device, which may include an analog-to-digital converter configured to convert analog signals from the sensor 714 to digital signals or images for processing. The processing system 716 may be configured to execute the computer readable instructions to analyze intensity and/or other characteristics of the sensed light beam to determine various defect characteristics, such as defect type, size, depth, or shape. In an example embodiment, the processing system 716 uses an algorithm or a look-up table, stored in memory, to determine defect characteristics.

The processor system 716 may be configured (e.g., with programming instructions) to provide a user interface (e.g., a computer screen) for configuring recipes, as well as displaying a resultant test image and other inspection characteristics. For instance, the controller may control selective activation of the illumination source, the illumination or output aperture settings, spatial filter selection, wavelength band, focus offset setting, polarization settings, etc.

The controller may be any suitable combination of software and hardware. For example, the controller may include a processor, coupled to input/output ports, and one or more memories via appropriate buses or other communication mechanisms. The processor and memory may be programmed to implement instructions of the method embodiments of the present invention. The controller may also include one or more input devices (e.g., a keyboard, mouse, joystick) for providing user input, such as changing focus depths, polarization settings, wavelength selection, or generally setting up an inspection recipe. The processing system 716 may also be coupled with various components of the system 700 for controlling, for example, a sample position (e.g., focusing and scanning), spatial filter selection, zoom setting, and other inspection parameters and configurations of the inspection system elements.

Because such information and program instructions may be implemented on a specially configured computer system, such a system includes program instructions/computer code for performing various operations described herein that can be stored on a computer readable media. Examples of machine-readable media include, but are not limited to, magnetic media such as hard disks, floppy disks, and magnetic tape; optical media such as CD-ROM disks; magneto-optical media such as optical disks; and hardware devices that are specially configured to store and perform program instructions, such as read-only memory devices (ROM) and random access memory (RAM). Examples of program instructions include both machine code, such as produced by a compiler, and files containing higher level code that may be executed by the computer using an interpreter.

It should be noted that the above description and drawings are not to be construed as a limitation on the specific components of the system and that the system may be embodied in many other forms. For example, it is contemplated that the inspection or measurement tool may have any suitable features from any number of known imaging or metrology tools arranged for detecting defects and/or resolving the critical aspects of features of a reticle or wafer. By way of example, an inspection or measurement tool may be adapted for bright field imaging microscopy, dark field imaging microscopy, full sky imaging microscopy, phase contrast microscopy, polarization contrast microscopy, and coherence probe microscopy. It is also contemplated that single and multiple image methods may be used in order to capture images of the target. These methods include, for example, single grab, double grab, single grab coherence probe microscopy (CPM) and double grab CPM methods. Non-imaging optical methods, such as scatterometry, may also be contemplated as forming part of the inspection or metrology apparatus.

In other inspection applications, the incident light or detected light may be passed through any suitable spatial aperture to produce any incident or detected light profile at any suitable incident angles. By way of examples, programmable illumination or detection apertures may be utilized to produce a particular beam profile, such as dipole, quadrapole, quasar, annulus, etc. In a specific example, pixelated illumination techniques may be implemented. Programmable illuminations and special apertures can serve the purpose of enhancing feature contrast for certain patterns on the reticle, in addition to any of the phase contrast techniques described above.

The inspection apparatus may be suitable for inspecting semiconductor devices or wafers and optical reticles, including EUV reticles or masks. Other types of samples which may be inspected or imaged using the inspection apparatus and techniques of the present invention include any surface, such as solar panel structures, optical disks, flat panel displays, etc.

In general, an inspection tool may include at least one light source for generating an incident light beam, illumination optics for directing the incident beam onto a sample, collection optics for directing an output beam that is emitted from the sample in response to the incident beam, one or more selectable spatial filters for correcting system aberration, a sensor for detecting the output beam and generating an image or signal for the output beam, and a controller for controlling the components of the inspection tool and facilitating the inspection techniques as described further herein.

Figure 8:
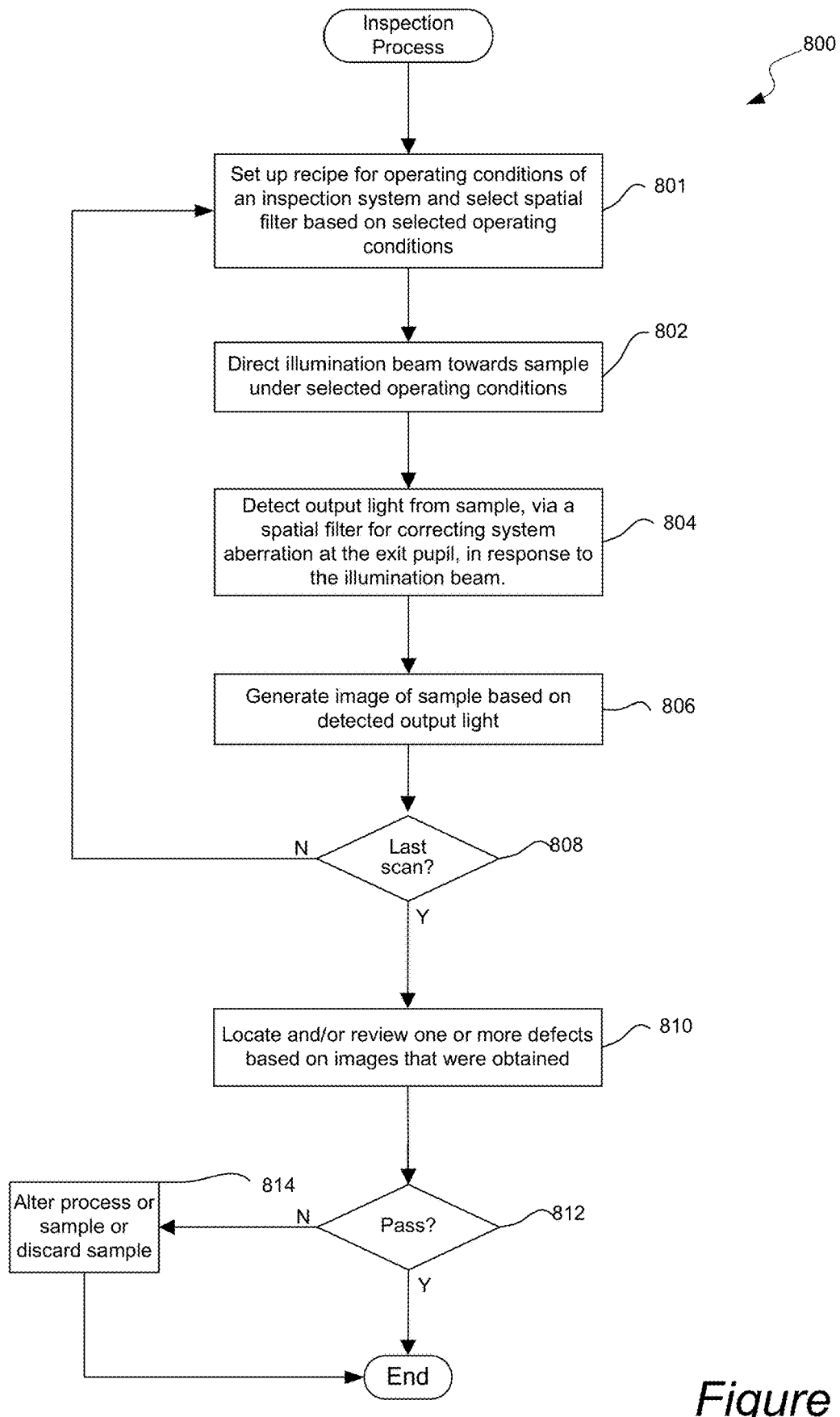
FIG. 8 is a flow chart illustrating an inspection process in accordance with one embodiment of the present invention.

With the inspection being configured with a selectable spatial filter plate, a reticle can then be inspected for locating defects using any suitable inspection technique. FIG. 8 is a flow chart illustrating an inspection process 800 in accordance with one embodiment of the present invention. Initially, a recipe may be set up for the operating conditions of an inspection system in operation 801. This recipe set up process may also include selection of a spatial filter based on the selected operating conditions. For instance, a spatial filter for the selected wavelength range and polarization setting will be selected. An illumination beam may then be directed towards the sample under the selected operating conditions in operation 802. For example, an illumination beam is scanned across a portion of a reticle.

Output light that is reflected or scattered from the sample in response to the illumination beam may then be detected via a spatial filter for correcting system aberration at the exit pupil in operation 804. In general, the spatial filter is designed or configured in accordance with any of the spatial filter design techniques described herein. An image may also be generated based on the detected output light in operation 806.

It may then be determined whether this is the last scan in operation 808. For instance, the sample may be scanned using other operating conditions and corresponding spatial filters. If the scans are not complete, one or more illumination beams may be scanned while collecting output light (and images), via one or more selected spatial filters, by repeating operations 801, 802, 804, and 806.

If scans for all sets of operating conditions are complete, one or more defects may be located and/or reviewed based on the obtained images (or signals) in operation 810. In one embodiment, any suitable inspection analysis process may be performed to first find defects. For instance, a cell-to-cell, die-to-die, or die-to-database comparison can be made between each test and reference image. For example, defects may be detected for an imaged area at a particular position in a die that differs from another reference image area at the same position, which is obtained from another die, cell, or simulated from a design database.

Referring back to FIG. 8, it may then be determined whether the sample has passed inspection in operation 812. It may also be determined whether the defect is repairable. If the sample does not pass, the process or sample may be altered in operation 814. The sample may alternatively be discarded, in addition to altering the process.

The above described techniques for designing a spatial filter to compensate for system aberration at the pupil plane work well in systems that have minimal field-dependent aberration effects.

Figure 9:
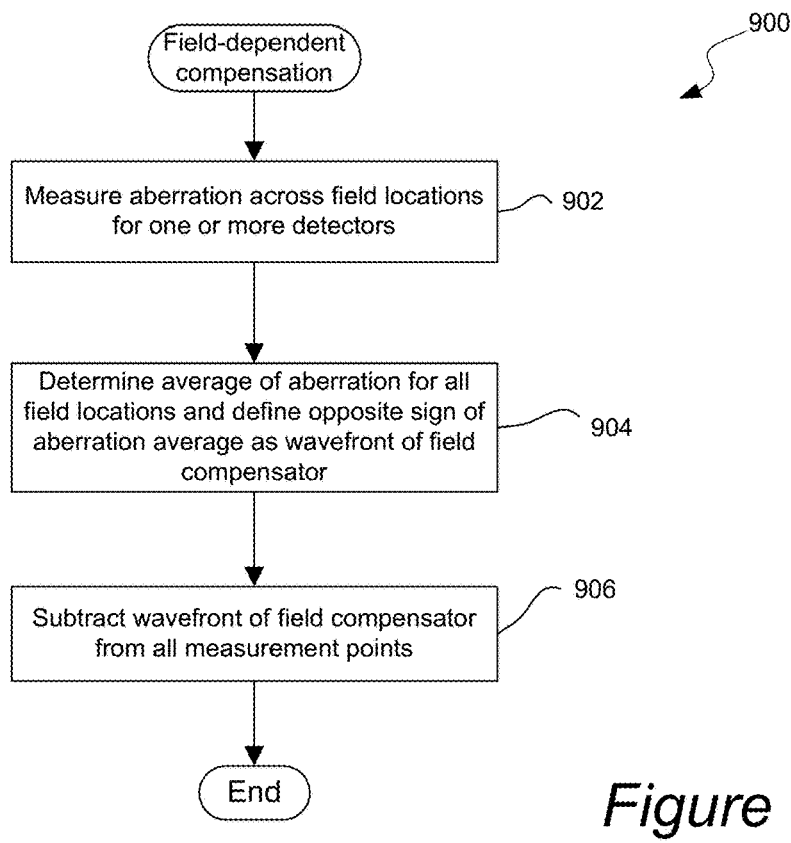
FIG. 9 is a flow chart illustrating a compensation process with the presence of field-dependent aberration in accordance with an alternative embodiment of the present invention.

FIG. 9 is a flow chart illustrating a compensation process 900 with the presence of some level of field-dependent aberration in accordance with an alternative embodiment of the present invention. Initially, aberration may be measured across a plurality of field locations of one or more detectors in operation 902. For instance, aberration at a plurality of field locations for two TDI sensor 2D arrays can be measured. The average aberration for all field locations can be determined in operation 904. The opposite sign of this aberration average may then be defined as the target wavefront for the compensator design in order to remove the field-independent aberration component from the system in operation 904. The wavefront of the field compensator may then be subtracted from all measurement points in operation 906.

Figure 10:
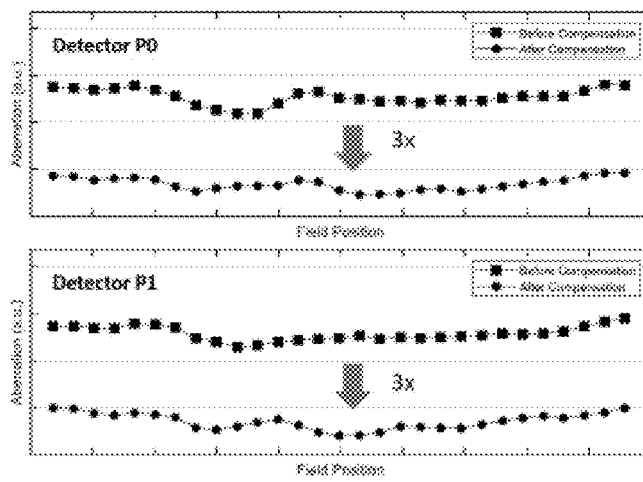
FIG. 10 shows the estimated performance of a wavefront compensator in a particular inspection system under circular polarization in accordance with a specific implementation of the present invention.

FIG. 10 shows the estimated performance of a wavefront compensator in a particular inspection system under circular polarization in accordance with a specific implementation of the present invention. As shown, the system optical aberration has been measured as a function of imaging field y location in two time-domain integration (TDI) sensor planes, denoted as P0 and P1, of the inspection system. Direction x is the stage scanning direction. With the wavefront correction being implemented at the pupil plane, its effect can be said to be common to all detector field locations. The film thickness of the wavefront compensator is therefore designed to fully correct the averaged wavefront across all field positions. Despite this limitation, the field-independent portion of the wavefront on some inspection systems is significant and can be effectively corrected. As a result, in this example, the wavefront of the tool can be reduced significantly by approximately 3 times in all field positions. This wavefront reduction would be greatly beneficial to an EUV mask inspection, using such tool, to improve its sensitivity and tool-tool matching. Similar results were found for linear polarization operating conditions as well.

Regardless of additional field-dependent compensation, a system wavefront compensator can be used in both transmission and reflection modes with high optical efficiency at a DUV wavelength down to 193 nm. A spatial filter can be fabricated with flexible aperture size to fit any given inspection system. When implemented in transmission mode, the spatial filter plate can be inserted at the imaging pupil of the existing inspection system, by way of example, without redesign of the optical components or changes in the system optical layout. The spatial filter plate also has excellent long-term stability and is virtually maintenance free and can be fabricated at a relatively low cost.

A transmission-type wavefront compensator, as described herein, could be implemented at the imaging pupil plane in replacement of the existing hard aperture. The patterned chrome film on the wavefront compensator could serve the purpose of a hard aperture. Due to the small field cone angle at the pupil, the optical path length difference and distortion introduced by the substrate of the wavefront compensator could be neglected when the substrate thickness is small enough ($\leq 1$ mm).

Although the foregoing invention has been described in some detail for purposes of clarity of understanding, it will be apparent that certain changes and modifications may be practiced within the scope of the appended claims. It should be noted that there are many alternative ways of implementing the processes, systems, and apparatus of the present invention. For example, the defect detection characteristic data may be obtained from a transmitted, reflected, or a combination output beam. Additionally, the inspection system's compensator can be designed for other wavelength ranges, such as a visible, ultraviolet or near infrared wavelength range, for defect detection or metrology applications. Accordingly, the present embodiments are to be considered as illustrative and not restrictive, and the invention is not to be limited to the details given herein.

What is claimed is:

1. An inspection system for detecting defects in a semiconductor sample, the system comprising:
    a light source for generating an illumination beam;
    an illumination lens system for directing the illumination beam towards a sample;
    a collection lens system for directing towards a detector output light from the sample in response to the illumination beam, wherein the collection lens system includes a compensator plate having a plurality of individually selectable filters having different configurations from each other for correcting different wavefront aberration errors of the output light caused by one or more optical components of the inspection system under different operating conditions, wherein each filter has a fixed design;
    the detector for receiving the output light from the sample; and
    a controller operable to perform the following operations in cooperation with the light source, illumination lens system, collection lens system, and detector:
        generating and directing the illumination beam towards the sample;
        selecting a set of the different operating conditions and a selected one of the filters for correcting the aberration error caused by the one or more optical components under such selected set of operating conditions;
        generating an image based on the output light from the sample in response to the illumination beam; and
        determining whether the sample passes or fails inspection or characterizing such sample based on the image.

2. The system of claim 1, wherein the plurality of filters are arranged in a grid pattern on the compensator plate, and individual ones of the filters are selectable by moving the compensator plate in X and Y directions that are perpendicular to the illumination beam.

3. The system of claim 1, wherein the plurality of filters are arranged in a circular pattern on the compensator plate, and individual ones of the filters are selectable by rotating the compensator plate under the illumination beam.

4. The system of claim 1, wherein the different operating conditions include different polarizations.

5. The system of claim 4, wherein the different polarizations include circular and linear polarizations.

6. The system of claim 4, wherein the different operating conditions include different zoom settings, different numerical apertures, and different wavelength ranges, including a deep ultraviolet range.

7. The system of claim 1, wherein the different configurations of the filters comprise different variations in thickness of a dielectric thin film deposited on a transparent substrate to correct the different wavefront aberration errors caused by the one or more optical components under the different operating conditions.

8. The system of claim 1, wherein the different configurations of the filters comprise different variations in height of a transparent substrate to correct the different wavefront aberration errors caused by the one or more optical components under the different operating conditions.

9. The system of claim 1, wherein the different configurations of the filters comprise different variations in thickness of a dielectric thin film coated on a reflecting substrate to correct the different wavefront aberration errors caused by the one or more optical components under the different operating conditions.

10. The system of claim 1, wherein the different configurations of the filters comprise different variations in height of a reflecting multilayer thin film conformally coated on top of a substrate to correct the different wavefront aberration errors caused by the one or more optical components under the different operating conditions.

11. The system of claim 1, wherein the compensator plate is positioned for inserting a selected filter from the plurality of filters of the compensator plate at the image pupil of the system.

12. A method of designing and using a compensator in an inspection system for detecting defects in a semiconductor sample, the method comprising:

for a plurality of different sets of operating conditions, determining different wavefront aberration errors of the output light caused by one or more optical components of the inspection system;

fabricating a compensator plate having a plurality of filters having different configurations from each other for correcting the determined different wavefront aberration errors of the output light caused by one or more optical components under the different sets of operating conditions, wherein the configuration of each filter has a fixed design;

inserting the compensator plate within the inspection system so that each filter is individually selectable to be positioned at an image pupil of the inspection system;

on the inspection system, selecting a one of the different sets of operating conditions and selecting one of the filters that is configured to correct the aberration error caused by the one or more optical components determined for such selected set of operating conditions; and imaging the sample via the selected filter and under the selected set of operating conditions so that an image of the sample is formed via removal of the aberration error caused by the one or more optical components determined for the selected set of operating conditions.

13. The method of claim 12, wherein the different configurations of the plurality of filters are fabricated using an ion beam deposition with one or more pin hole or shadow masks to form different sets of variable heights in the substrates of the filters for correcting the different wavefront aberration errors caused by the one or more optical components under the different sets of operating conditions.

14. The method of claim 12, wherein the different configurations of the plurality of filters are fabricated using an ion-beam figuring process to etch different sets of variable heights in the substrates of the filters for correcting the different wavefront aberration errors caused by the one or more optical components under the different sets of operating conditions.

15. The method of claim 12, wherein the different sets of operating conditions include, different polarizations.

16. The method of claim 15, wherein the different polarizations include circular and linear polarizations.

17. The method of claim 15, wherein the different sets of operating conditions include different zoom settings, different numerical apertures, and different wavelength ranges, including a deep ultraviolet range.

18. The method of claim 12, wherein the different configurations of the filters comprise different variations in thickness of a dielectric thin film deposited on a transparent substrate to correct the determined different wavefront aberration errors caused by the one or more optical components under the different sets of operating conditions.

19. The method of claim 12, wherein the different configurations of the filters comprise different variations in height of a transparent substrate to correct the determined different wavefront aberration errors caused by the one or more optical components under the different sets of operating conditions.

20. The method of claim 12, wherein the different configurations of the filters comprise different variations in thickness of a dielectric thin film coated on a reflecting substrate to correct the different wavefront aberration errors caused by the one or more optical components under the different operating conditions.

21. The method of claim 12, wherein the different configurations of the filters comprise different variations in height of a reflecting multilayer thin film conformally coated on top of a substrate to correct the different wavefront aberration errors caused by the one or more optical components under the different operating conditions.

22. The method of claim 12, wherein the compensator plate is positioned for inserting a selected filter from the plurality of filters of the compensator plate at the image pupil of the system.

* * * * *